(12) United States Patent
Yabumoto

(10) Patent No.: US 10,686,332 B2
(45) Date of Patent: Jun. 16, 2020

(54) POWER CONVERSION DEVICE AND CONTACTLESS POWER SUPPLY SYSTEM

(71) Applicant: Mitsubishi Electric Corporation, Chiyoda-ku (JP)

(72) Inventor: Takuya Yabumoto, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 159 days.

(21) Appl. No.: 16/070,320

(22) PCT Filed: Oct. 24, 2016

(86) PCT No.: PCT/JP2016/081392
§ 371 (c)(1),
(2) Date: Jul. 16, 2018

(87) PCT Pub. No.: WO2017/134870
PCT Pub. Date: Aug. 10, 2017

(65) Prior Publication Data
US 2019/0027964 A1 Jan. 24, 2019

(30) Foreign Application Priority Data
Feb. 2, 2016 (JP) ................. 2016-017617

(51) Int. Cl.
*H02J 50/10* (2016.01)
*H02M 1/12* (2006.01)
(Continued)

(52) U.S. Cl.
CPC ............ *H02J 50/10* (2016.02); *G01R 19/175* (2013.01); *H01F 38/14* (2013.01); *H02J 50/12* (2016.02);
(Continued)

(58) Field of Classification Search
CPC ......... H02M 1/126; H02M 2001/0009; H02M 7/4807; H02M 7/53871; H02M 7/219;
(Continued)

(56) References Cited

U.S. PATENT DOCUMENTS 5,625,539 A * 4/1997 Nakata ................ H02M 7/4807
363/132
2014/0140420 A1 * 5/2014 Ghovanloo ....... H04W 52/0209
375/259

(Continued)

FOREIGN PATENT DOCUMENTS

JP 2014-183684 A 9/2014

OTHER PUBLICATIONS

International Search Report dated Nov. 15, 2016 in PCT/JP2016/081392 filed Oct. 24, 2016.

*Primary Examiner* — Alfonso Perez Borroto
*Assistant Examiner* — Esayas G Yeshaw
(74) *Attorney, Agent, or Firm* — Oblon, McClelland, Maier & Neustadt, L.L.P.

(57) ABSTRACT

A power conversion device includes: an inverter for supplying high-frequency power to a coil; a harmonic filter connected to an output side of the inverter; and a controller for performing control to make a zero-cross point of an output current from the inverter coincide with a zero-cross point of a filter current of the harmonic filter. Through this, harmonic reduction effect can be fully exerted. Further, a contactless power supply system using the power conversion device can supply, to a load, power in which harmonics are significantly reduced, addressing a problem that inverter driving frequency cannot be controlled to a frequency at which harmonic reduction effect is maximized, and harmonic reduction effect cannot be fully exerted.

13 Claims, 19 Drawing Sheets

(51) Int. Cl.
*H02J 50/12* (2016.01)
*H02J 50/70* (2016.01)
*H02M 7/5387* (2007.01)
*G01R 19/175* (2006.01)
*H01F 38/14* (2006.01)
*H02M 7/48* (2007.01)
*H02M 1/00* (2006.01)
*G01R 19/165* (2006.01)
*H01F 38/28* (2006.01)
*H02M 7/219* (2006.01)

(52) U.S. Cl.
CPC ............ *H02J 50/70* (2016.02); *H02M 1/126* (2013.01); *H02M 7/4807* (2013.01); *H02M 7/53871* (2013.01); *G01R 19/16547* (2013.01); *H01F 38/28* (2013.01); *H02M 7/219* (2013.01); *H02M 2001/0009* (2013.01)

(58) Field of Classification Search
CPC . H02J 50/70; H02J 50/10; H02J 50/12; G01R 19/16547; G01R 19/175; H01F 38/14; H01F 38/28
See application file for complete search history.

(56) References Cited

U.S. PATENT DOCUMENTS

| | | | |
|---|---|---|---|
| 2014/0285027 A1* | 9/2014 | Sakamoto | B60L 11/182 307/104 |
| 2015/0326031 A1* | 11/2015 | Yamaguchi | H02J 7/04 307/104 |
| 2015/0357988 A1* | 12/2015 | Yokozutsumi | B60L 58/21 318/504 |

* cited by examiner

POWER CONVERSION DEVICE AND CONTACTLESS POWER SUPPLY SYSTEM

TECHNICAL FIELD

The present invention relates to a power conversion device and a contactless power supply system using the power conversion device.

BACKGROUND ART

A conventional contactless power supply system includes a filter interposed between an inverter and a power transmission coil for the purpose of reducing a harmonic current flowing through the power transmission coil, thereby reducing a current flowing through the power transmission coil (e.g., Patent Document 1).

CITATION LIST

Patent Document

Patent Document 1: Japanese Laid-Open Patent Publication No. 2014-183684

SUMMARY OF THE INVENTION

Problems to be Solved by the Invention

In such a contactless power supply system, frequency characteristics vary due to, for example, errors in a reactor and a capacitor that form the filter. Although it is ideal to control driving frequency of the inverter such that harmonic attenuation is maximized, it is difficult to directly measure a harmonic component of the current flowing through the power transmission coil for each operation in an individual contactless power supply system. Therefore, the driving frequency of the inverter cannot be controlled to a frequency at which the harmonic reduction effect is at a maximum, and the harmonic reduction effect cannot be fully exerted.

Solution to the Problems

A power conversion device according to the present invention includes: an inverter for supplying high-frequency power to a coil; a harmonic filter including a first filter reactor connected to an output end of the inverter, a second filter reactor connected in series to the first filter reactor, a filter capacitor connected in series to the second filter reactor, and a filter current detector for detecting a zero-cross point of a filter current that flows through the second filter reactor; and a controller for controlling the inverter. The controller performs control so as to make a zero-cross point of an output current from the inverter coincide with a zero-cross point of the filter current that flows through the second filter reactor.

A contactless power supply system according to the present invention includes: the above-described power conversion device; a power-receiving coil being magnetically coupled with the coil supplied with the high-frequency power, and being supplied with power in a contactless manner by the coil; and a rectifier for rectifying an output from the power-receiving coil, and supplying power to a load.

Effect of the Invention

According to the power conversion device of the present invention, the degree of harmonic reduction in a harmonic filter can be increased.

The contactless power supply system of the present invention can supply harmonic-reduced power to a load.

DESCRIPTION OF EMBODIMENTS

Embodiment 1

Basic Configuration

Figure 1:
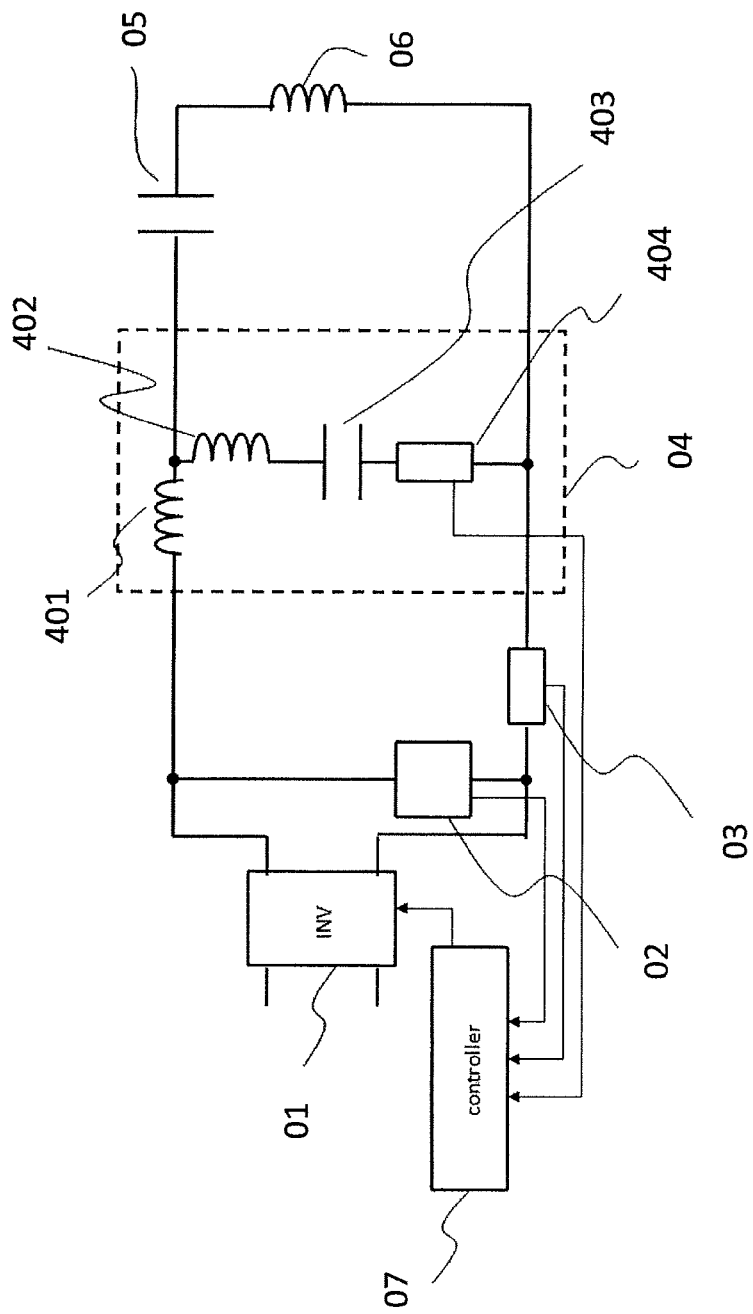
FIG. 1 is a diagram showing the entire configuration of a power conversion device according to Embodiment 1.

The basic configuration of a power conversion device according to Embodiment 1 will be described. FIG. 1 shows the entire configuration of the power conversion device according to Embodiment 1. An inverter output voltage detector 02 and an inverter output current detector 03 are connected to an output side of an inverter 01 that supplies high-frequency power. A harmonic filter 04 is connected at a stage subsequent to the inverter output voltage detector 02 and the inverter output current detector 03, and a power transmission capacitor 05 and a power transmission coil 06 are connected at a stage subsequent to the harmonic filter 04.

The harmonic filter 04 is composed of a first filter reactor 401, a second filter reactor 402, a filter capacitor 403, and a filter current detector 404.

Figure 2:
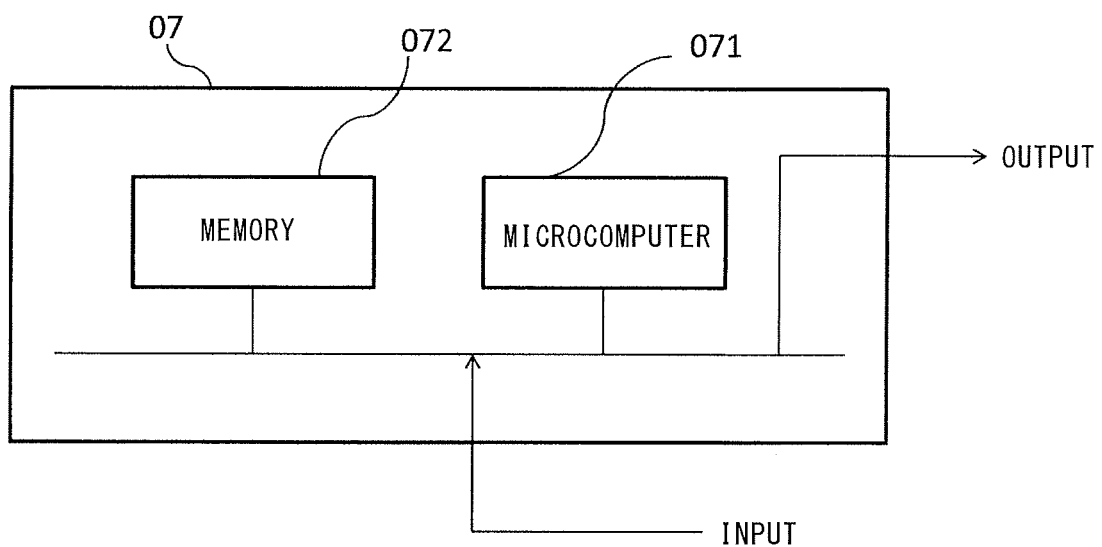
FIG. 2 is a conceptual diagram showing the configuration of a controller according to Embodiment 1 of the present invention.

As shown in FIG. 2, a controller 07 is composed of: a microprocessor 071 (hereinafter referred to as microcomputer); a memory 072 that stores a program of the microcomputer 071; other logic circuits; and the like. The controller 07 is able to receive a signal at a zero-cross timing of each of the inverter output voltage detector 02, the inverter output current detector 03, and the filter current detector 404, and control driving frequency of the inverter 01 in accordance with these signals.

Specific Example of Zero-Cross Detection

Figure 3A:
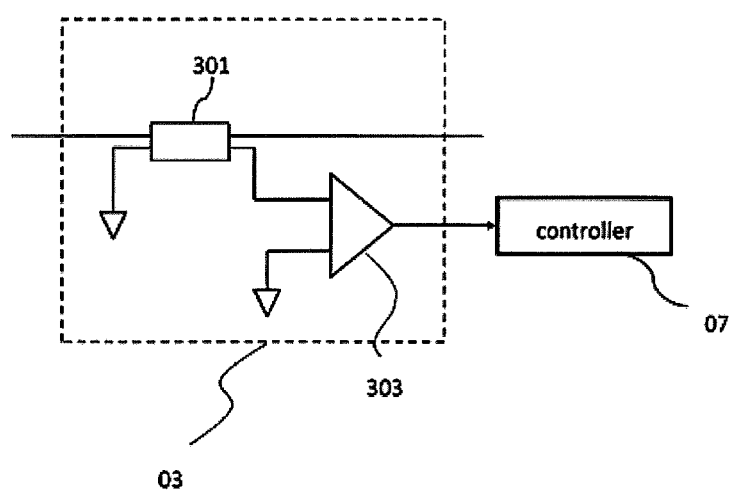
FIG. 3A is a circuit configuration diagram showing an inverter output current detector according to Embodiment 1 of the present invention.
Figure 3B:
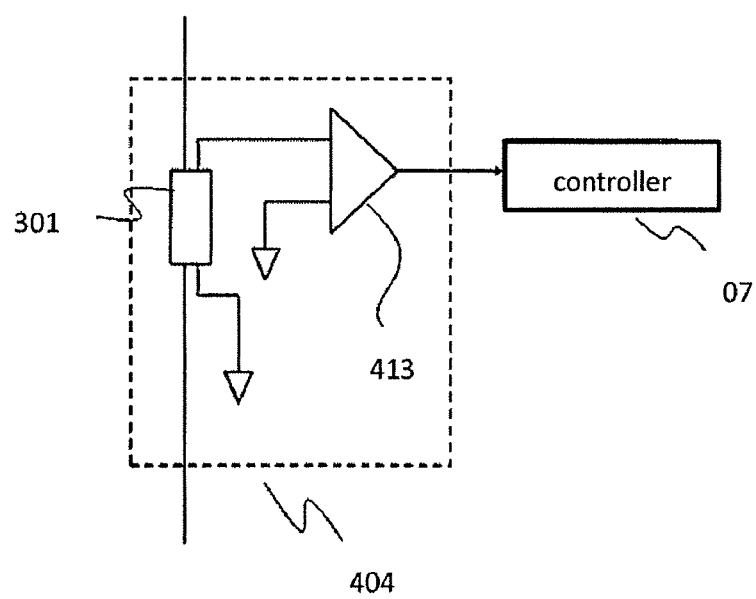
FIG. 3B is a circuit configuration diagram showing a filter current detector according to Embodiment 1 of the present invention.

FIG. 3A is a circuit configuration diagram of the inverter output current detector 03 according to Embodiment 1. FIG. 3B is a circuit configuration diagram of the filter current detector 404 according to Embodiment 1. In FIG. 3A or FIG. 3B, the inverter output current detector 03 or the filter current detector 404 is composed of: a current measurement element 301 such as a current detection resistor or a current transformer; and a comparator 303, 413. The comparator 303, 413 compares a reference voltage (0 V in this embodiment) with a voltage (inter-terminal voltage) generated in the current measurement element 301, and the controller 07 receives, as a zero-cross point, rising of an output from the comparator 303, 413 when the inter-terminal voltage exceeds 0 V.

Figure 4A:
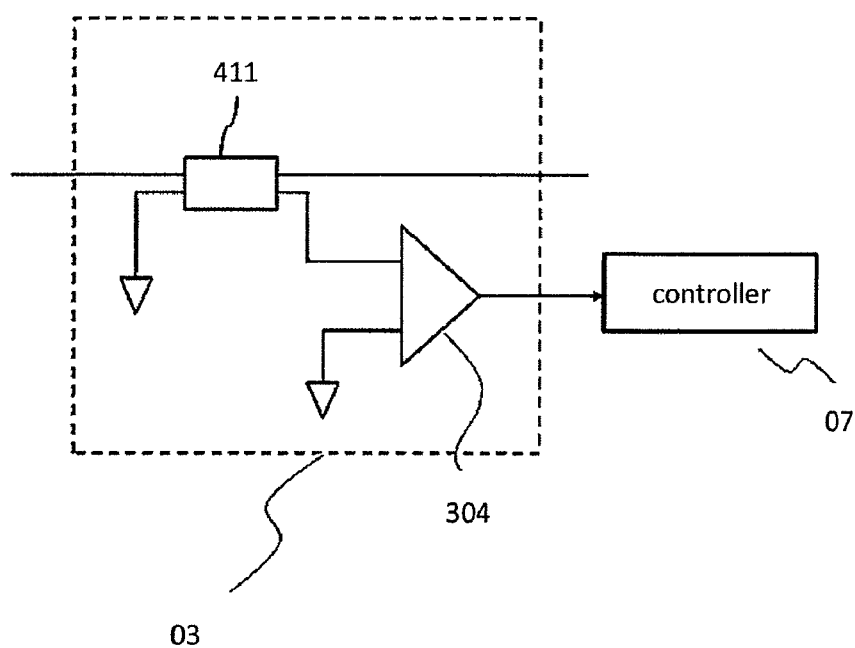
FIG. 4A is a circuit configuration diagram showing another inverter output current detector according to Embodiment 1 of the present invention.
Figure 4B:
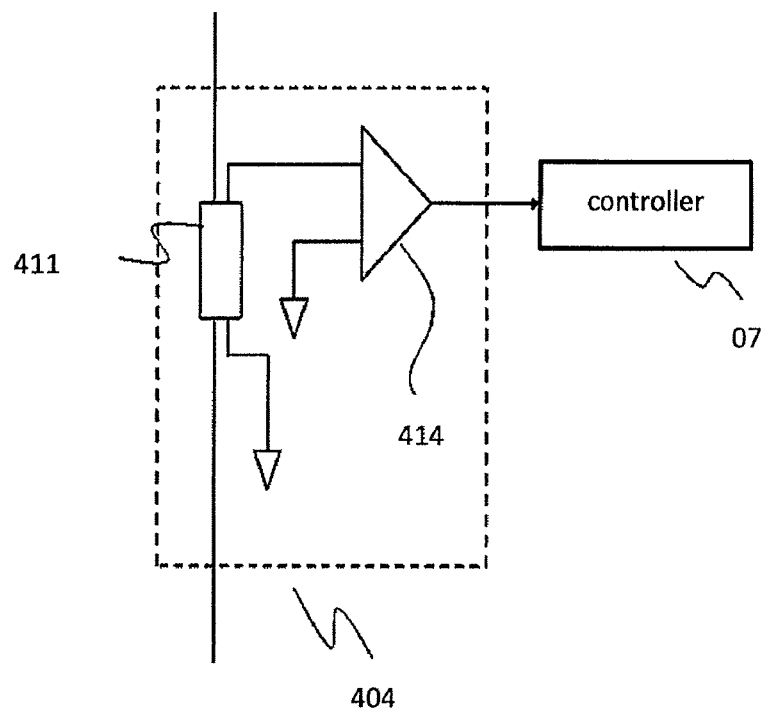
FIG. 4B is a circuit configuration diagram showing another filter current detector according to Embodiment 1 of the present invention.

As an alternative method, FIG. 4A and FIG. 4B show an inverter output current detector 03 and a filter current detector 404, respectively, each being composed of a current measurement element 411 having the same function as the current measurement element 301, and an operational amplifier 304, 414 instead of the comparator 303, 413 shown in FIG. 3A, FIG. 3B. By an analog-to-digital conversion function of the microcomputer 071 included in the controller 07, a current value of an output from the operational amplifier 304, 414 is measured at a frequency higher than the driving frequency of the inverter 01, and a time point at which the current changes from positive to negative or from negative to positive may be detected as a zero-cross point.

Example of Setting of Filter Characteristics

In Embodiment 1, the harmonic filter 04 is configured for the purpose of preventing a third-order harmonic current of the driving frequency of the inverter 01 from being flowed through the power transmission coil 06. Therefore, in the following description, the harmonic filter 04 will be described as a third-order harmonic filter. However, the harmonic filter 04 may be configured for the purpose of reducing harmonic currents such as a fifth-order harmonic current or a seventh-order harmonic current.

Basic Operation

Figure 5:
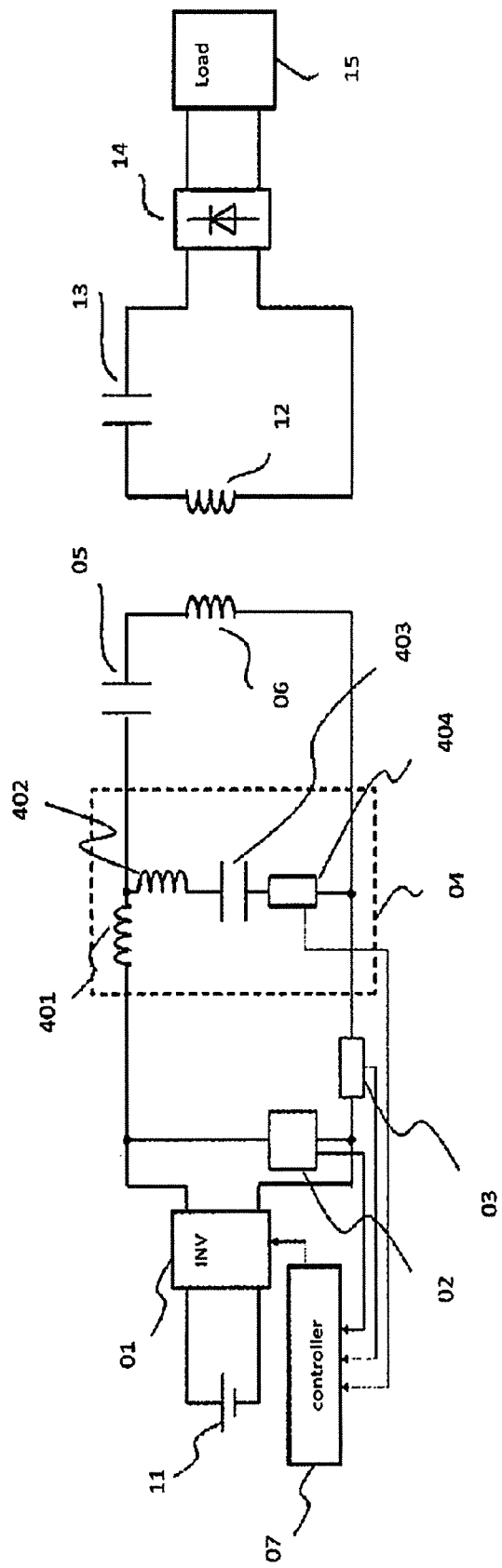
FIG. 5 is a diagram showing the entire configuration of a contactless power supply system using the power conversion device according to Embodiment 1 of the present invention.

FIG. 5 shows the entire configuration of a contactless power supply system using the aforementioned power conversion device. The basic operation of the power conversion device will be described with reference to FIG. 5.

The inverter 01 is connected to a DC power supply 11. DC power from the DC power supply 11 is inputted to the inverter 01, and the inverter 01 performs switching at driving frequency $f_{inv}$, and outputs high-frequency power. The inverter 01 may have any configuration as long as it can convert DC power to AC power. For example, a full-bridge inverter or a half-bridge inverter may be used.

The high-frequency power outputted from the inverter 01 passes through the harmonic filter 04, and is inputted to the power transmission coil 06 via the power transmission capacitor 05. A high-frequency current flowing through the power transmission coil 06 generates a high-frequency magnetic field in a space around the power transmission coil 06. Owing to interlinkage of the high-frequency magnetic field with a power-receiving coil 12, power is supplied in a contactless manner from the power transmission coil 06 to the power-receiving coil 12.

A power-receiving capacitor 13 is connected to the power-receiving coil 12, and power is supplied to a load 15 via a rectifier diode 14. Although the power-receiving coil 12 and the power-receiving capacitor 13 are connected in series in FIG. 5, this configuration is merely an example, and the contactless power supply system is not limited thereto.

Figure 6:
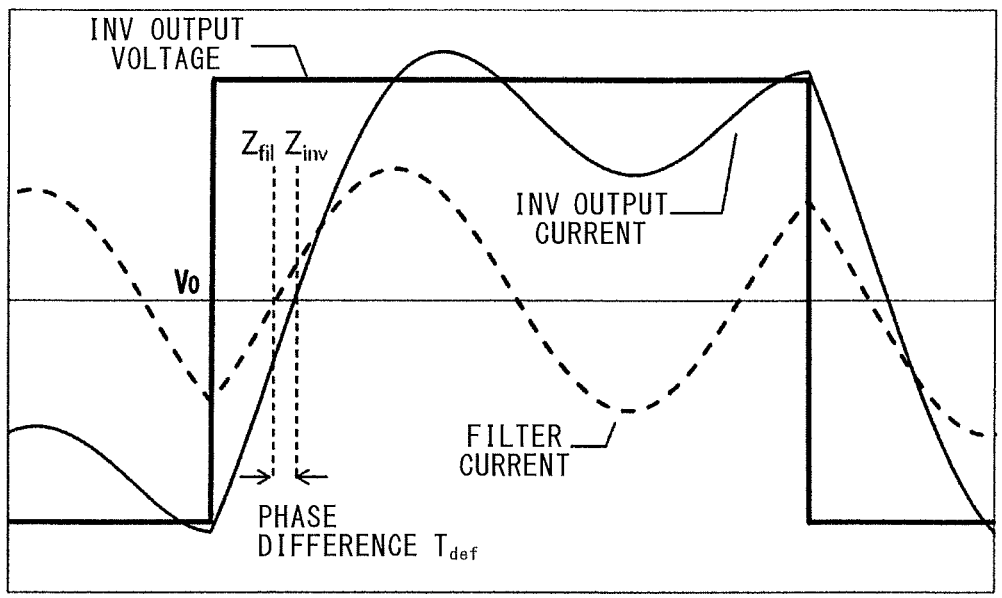
FIG. 6 is a waveform diagram showing inverter driving frequency control according to Embodiment 1 of the present invention.
Figure 7:
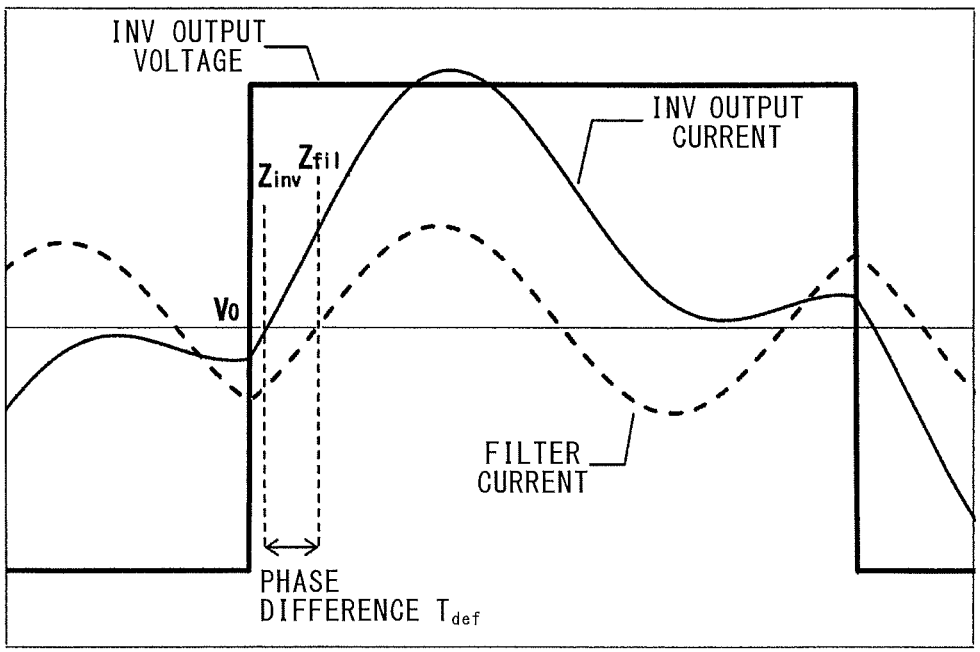
FIG. 7 is a waveform diagram showing the inverter driving frequency control at a time point different from FIG. 6, according to Embodiment 1 of the present invention.
Figure 8:
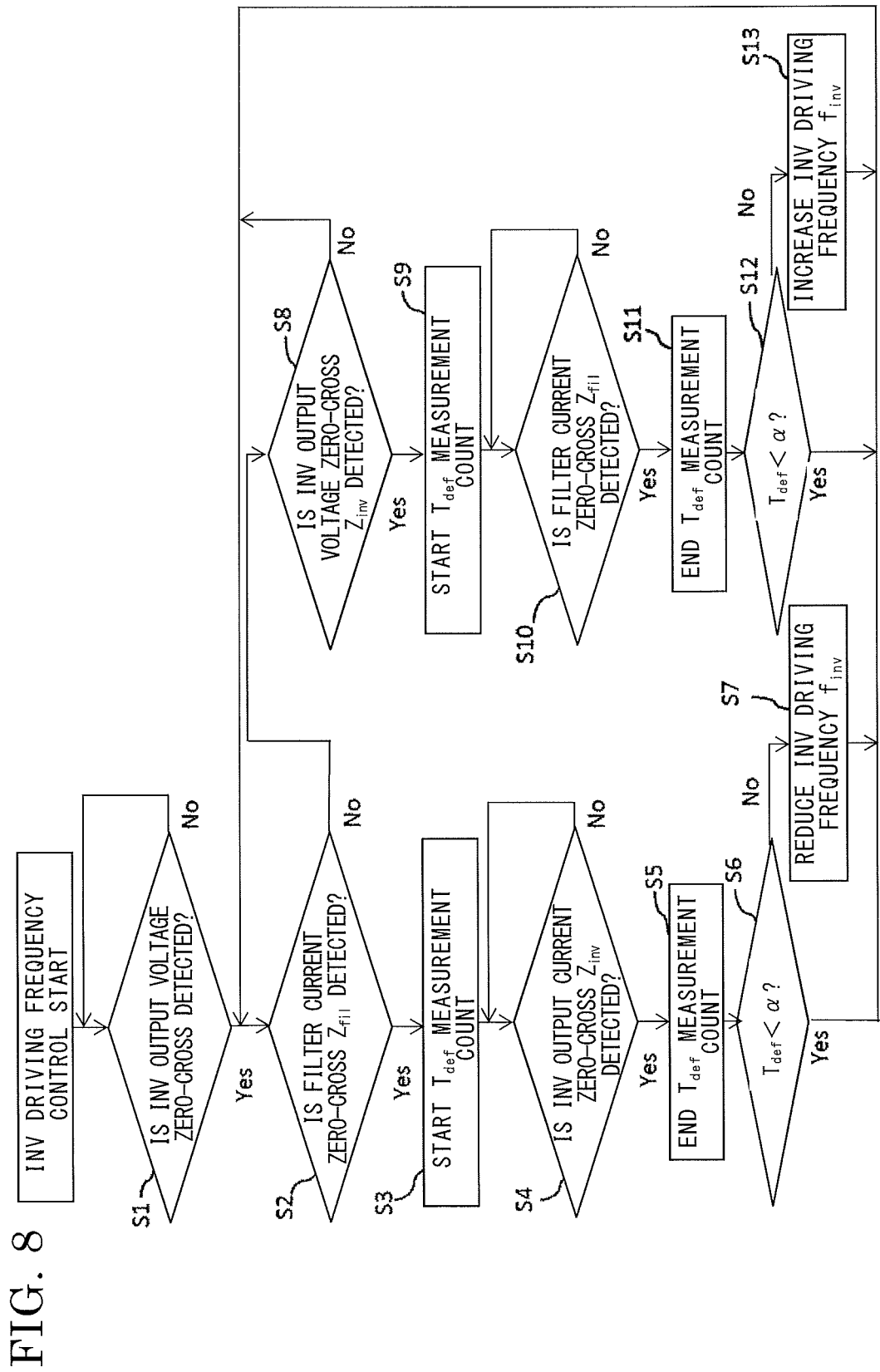
FIG. 8 is a flowchart of the inverter driving frequency control according to Embodiment 1 of the present invention.

Next, control of driving frequency of the inverter will be described. FIG. 6 is a waveform diagram showing examples of waveforms of an inverter output voltage, an inverter output current, and a filter current during the aforementioned operation. FIG. 7 is a waveform diagram showing waveforms of the inverter output voltage, the inverter output current, and the filter current at a time point different from FIG. 6. FIG. 8 is a flowchart of the inverter driving frequency control. Hereinafter, the inverter driving frequency control will be described with reference to the waveform diagrams of FIG. 6 and FIG. 7, based on the flowchart of FIG. 8. In FIG. 6 and FIG. 7, the vertical axis indicates the magnitudes of the voltage and the currents, and the horizontal axis indicates the passage of time. Management of the flowchart is performed by the controller 07. That is, management of the flowchart may be implemented by the microcomputer 071 using software in the memory 072, or may be partially implemented by a logical circuit.

in FIG. 6, with reference to rising of the inverter output voltage in the positive direction, there is a first-time zero-cross point $Z_{fil}$ of the filter current in the negative to positive direction, and after the zero-cross point $Z_{fil}$, there is a zero-cross point $Z_{inv}$, of the inverter output current in the negative to positive direction. The zero-cross point $Z_{fil}$ and the zero-cross point $Z_{inv}$ are detected by the filter current detector 404 and the inverter output current detector 03, respectively. The detected zero-cross points are received by the controller 07, and a time (phase difference) $T_{def}$ from the zero-cross point $Z_{fil}$ to the zero-cross point $Z_{inv}$, is measured.

The above control will be described with reference to the flowchart of FIG. 8. First, a zero-cross point V0 of the inverter output voltage is received by the controller 07 (S1 in FIG. 8). Thereafter, it is determined whether or not the zero-cross point $Z_{fil}$ of the filter current has been detected (S2), and counting of time starts when the controller 07 has received the detection (S3). Next, it is determined whether or not the zero-cross point $Z_{inv}$, of the inverter output current has been detected (S4), and counting of time ends when the controller 07 has received the zero-cross point $Z_{inv}$ (S5). Thus, the time (phase difference) $T_{def}$ between the zero-cross points is obtained (S5), The method for obtaining the time (phase difference) $T_{def}$ between the zero-cross points is not limited to the above method, and other methods may be adopted. The time (phase difference) $T_{def}$ between the zero-cross points is compared with, for example, a predetermined threshold α (S6). Then, if the phase difference $T_{def}$ is greater than the threshold α, the inverter driving frequency is lowered (S7), whereby the phase difference $T_{def}$ is reduced. By repeating this operation at regular intervals, the phase difference $T_{def}$ is gradually reduced. When the phase difference $T_{def}$ has become smaller than or equal to the threshold α, the inverter driving frequency $f_{inv}$ is not changed.

Next, in the case of FIG. 7, with reference to rising of the inverter output voltage in the positive direction, the zero-cross point $Z_{fil}$ of the filter current lags behind the zero-cross point $Z_{inv}$, of the inverter output current. In this case, the controller 07 receives the zero-cross point V0 of the inverter output voltage (S1). Thereafter, it is determined whether or not the zero-cross point $Z_{fil}$ of the filter current has been detected (S2) or whether or not the zero-cross point of the inverter output current has been detected (S8). When the controller 07 has received the zero-cross point $Z_{inv}$, of the inverter output current firstly, the controller 07 starts counting of time (S9). Next, it is determined whether or not the zero-cross point $Z_{fil}$ of the filter current has been detected (S10), and counting of time ends when the controller 07 has received the detection (S11), thereby obtaining the phase difference $T_{def}$. This phase difference $T_{def}$ is compared with the threshold α (S12). When the phase difference $T_{def}$ is greater than the threshold α, the inverter driving frequency is changed. However, as shown in FIG. 6, if the zero-cross point $Z_{inv}$, of the inverter output current is detected earlier than the zero-cross point $Z_{fil}$ of the filter current and received by the controller 07, the inverter driving frequency $f_{inv}$, is increased (S13). By repeating this operation at regular intervals, the phase difference $T_{def}$ is gradually reduced. When the phase difference $T_{def}$ has become smaller than or equal to the threshold α, the inverter driving frequency $f_{inv}$ is not changed.

In the flowchart shown in FIG. 8, when the phase difference $T_{def}$ has become smaller than or equal to the predetermined threshold α, changing the inverter driving frequency $f_{inv}$ is stopped. However, changing the inverter driving frequency $f_{inv}$, may be stopped when the phase difference $T_{def}$ has become 0 or a possible minimum value β. The predetermined threshold α or the possible minimum value β is not particularly limited because it varies depending on the method for measuring the time between the zero-cross points, the operation clock of the microcomputer, and the like.

Figure 9:
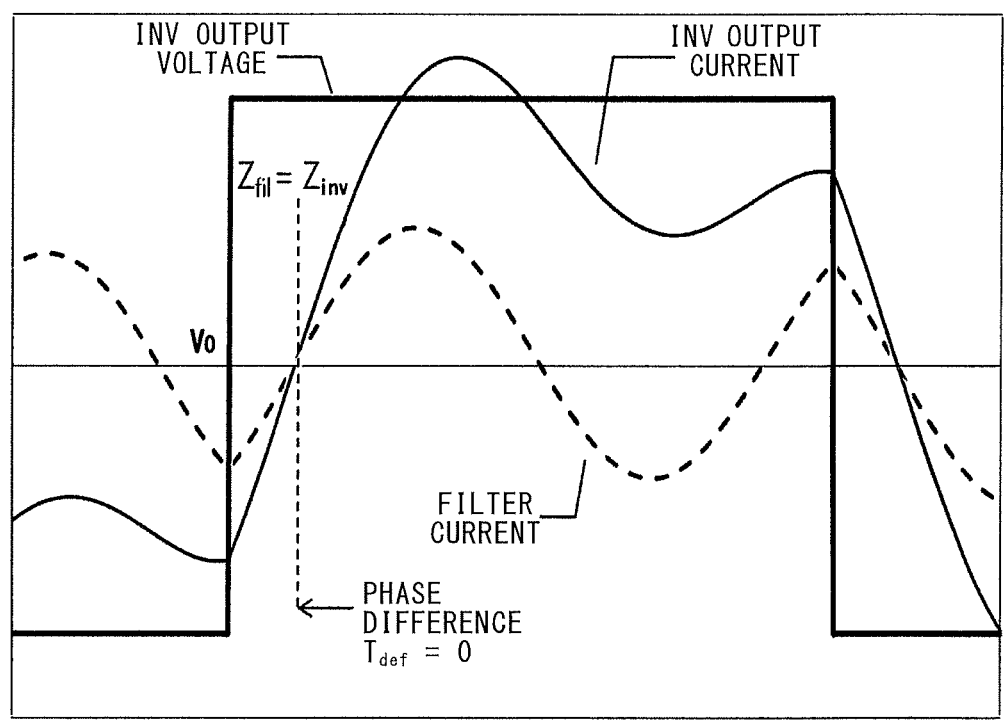
FIG. 9 is a waveform diagram after the inverter driving frequency control according to Embodiment 1 of the present invention.

As a result of the inverter driving frequency control described above, the phases of the inverter output voltage, the inverter output current, and the filter current are as shown in FIG. 9. With reference to the zero-cross point V0 of the inverter output voltage, the zero-cross point $Z_{fil}$ of the filter current coincides with the zero-cross point $Z_{inv}$, of the inverter output current. At this time, the third-order harmonic current flowing through the power transmission coil 06 has been maximally reduced. The reason for this will be described later.

In Embodiment 1, the zero-cross point of the inverter output current and the zero-cross point $Z_{inv}$, of the filter current are measured with reference to the zero-cross point V0 of the inverter output voltage that is obtained by the inverter output voltage detector 02. However, instead of this method, the zero-cross point $Z_{inv}$, of the inverter output current and the zero-cross point $Z_{fil}$ of the filter current may be measured with reference to a gate signal (e.g., falling of the gate signal) inputted from the controller 07 to the inverter 01.

Next, the reason why the third-order harmonic flowing through the power transmission coil 06 is maximally reduced by the aforementioned control method will be described in detail.

Description Relating to Harmonics in Contactless Power Supply System

First, harmonics in the contactless power supply system will be described.

Figure 10:
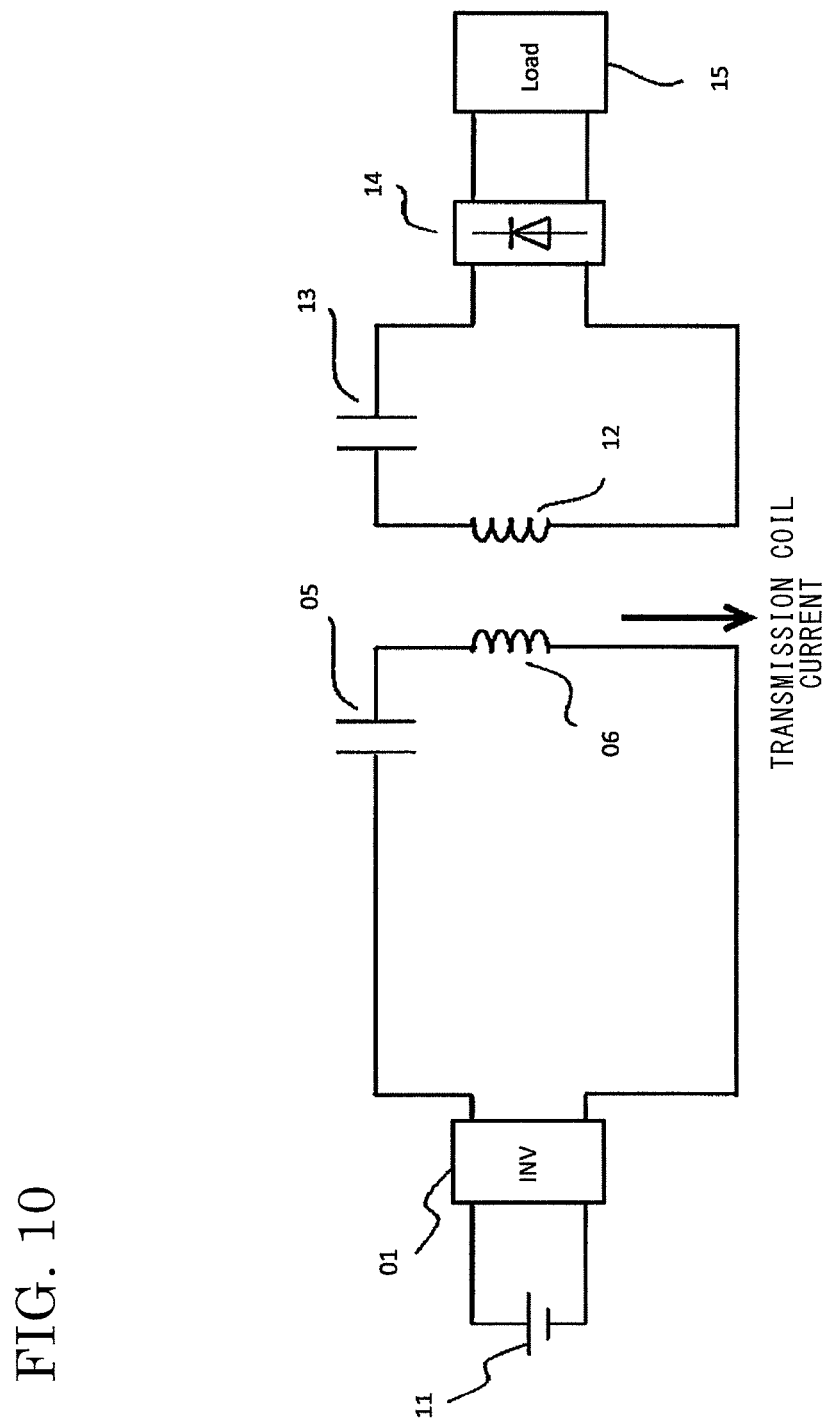
FIG. 10 is a diagram showing the entire configuration of a contactless power supply system including no harmonic filter.

FIG. 10 shows the entire configuration of a contactless power supply system including no harmonic filter. In this system, since a rectangular-wave voltage is outputted from the inverter 01, a harmonic component derived from this waveform is included in the power transmission coil 06.

Figure 11:
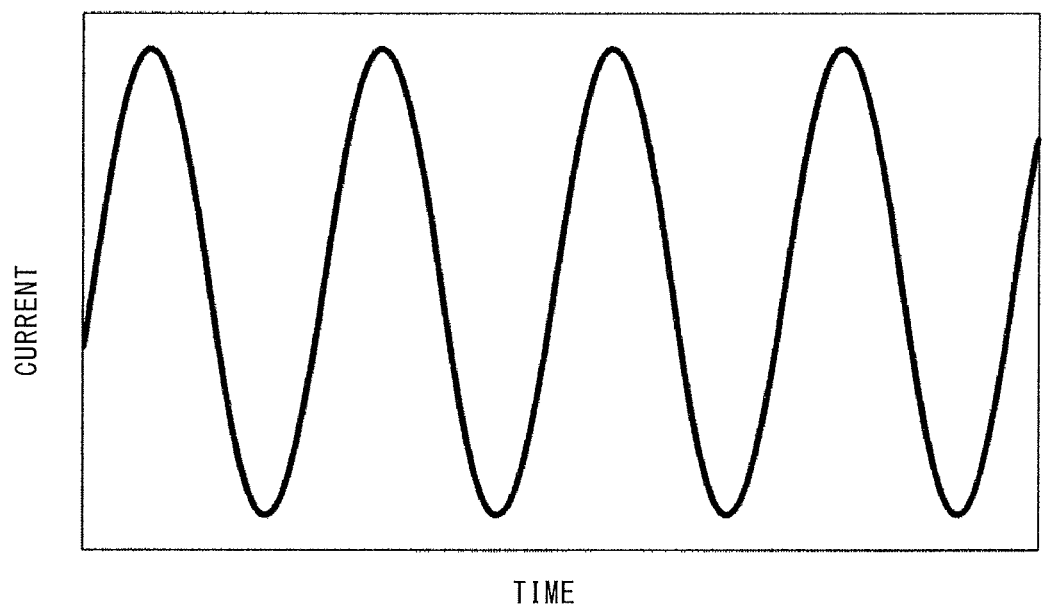
FIG. 11 is a waveform diagram of a current flowing through a power transmission coil in the contactless power supply system shown in FIG. 10.
Figure 12:
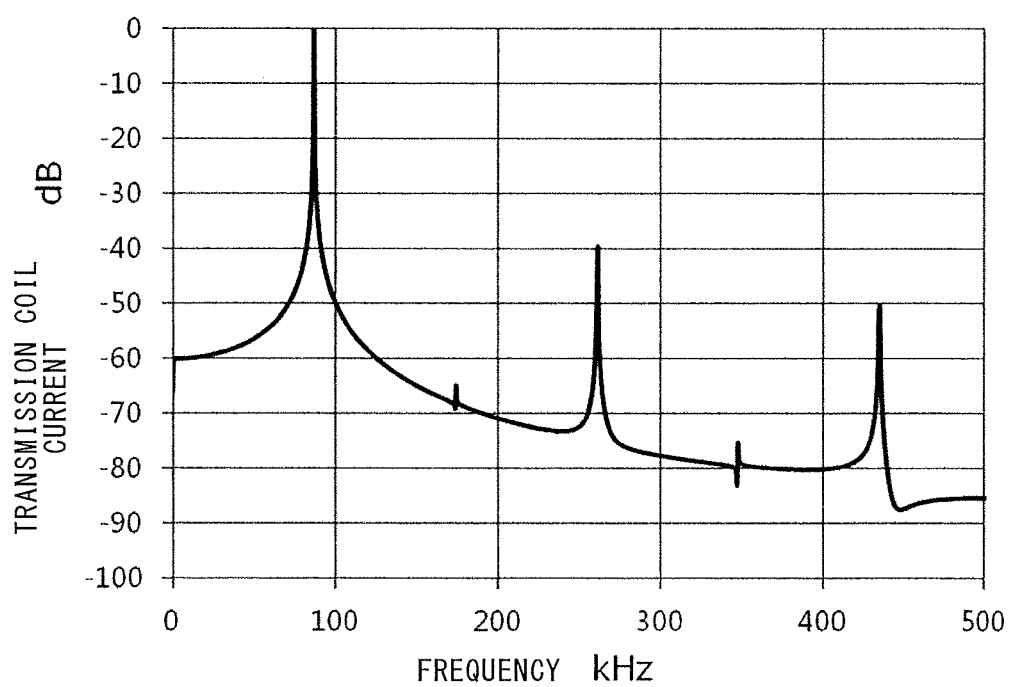
FIG. 12 is a diagram showing an analysis result of fast Fourier transform on the current flowing through the power transmission coil in the contactless power supply system shown in FIG. 10.

FIG. 11 is a waveform diagram of a current flowing through the power transmission coil 06, and FIG. 12 shows an analysis result of fast Fourier transform (FFT) on the current flowing through the power transmission coil 06. FIG. 11 and FIG. 12 show the results of a simulation analysis. In FIG. 12, a fundamental wave component (inverter driving frequency) is 0 dB. Although the current waveform shown in FIG. 11 looks like a sine wave, it is understood from the FFT analysis result shown in FIG. 12 that a third-order harmonic component is included in the fundamental wave component by 1% (−40 dB) of the fundamental wave component. In supplying power of kilowatt order, leakage electromagnetic field strength due to the third-order harmonic current may exceed the regulation under the law, and therefore needs to be reduced.

However, in the contactless power supply system as shown in FIG. 10, if an RC filter, an LR filter, or an LC filter capable of attenuating the third-order harmonic is inserted between the output end of the inverter and the power transmission coil 06, the power loss is great, and furthermore, phase characteristics of the fundamental wave component are adversely affected. Accordingly, the RC filter, the LR filter, and the LC filter are not suitable for reduction of a harmonic component close to the fundamental wave, such as a third-order harmonic component or a fifth-order harmonic component, in a power transmission system.

Description of Harmonic Filter

Figure 13:
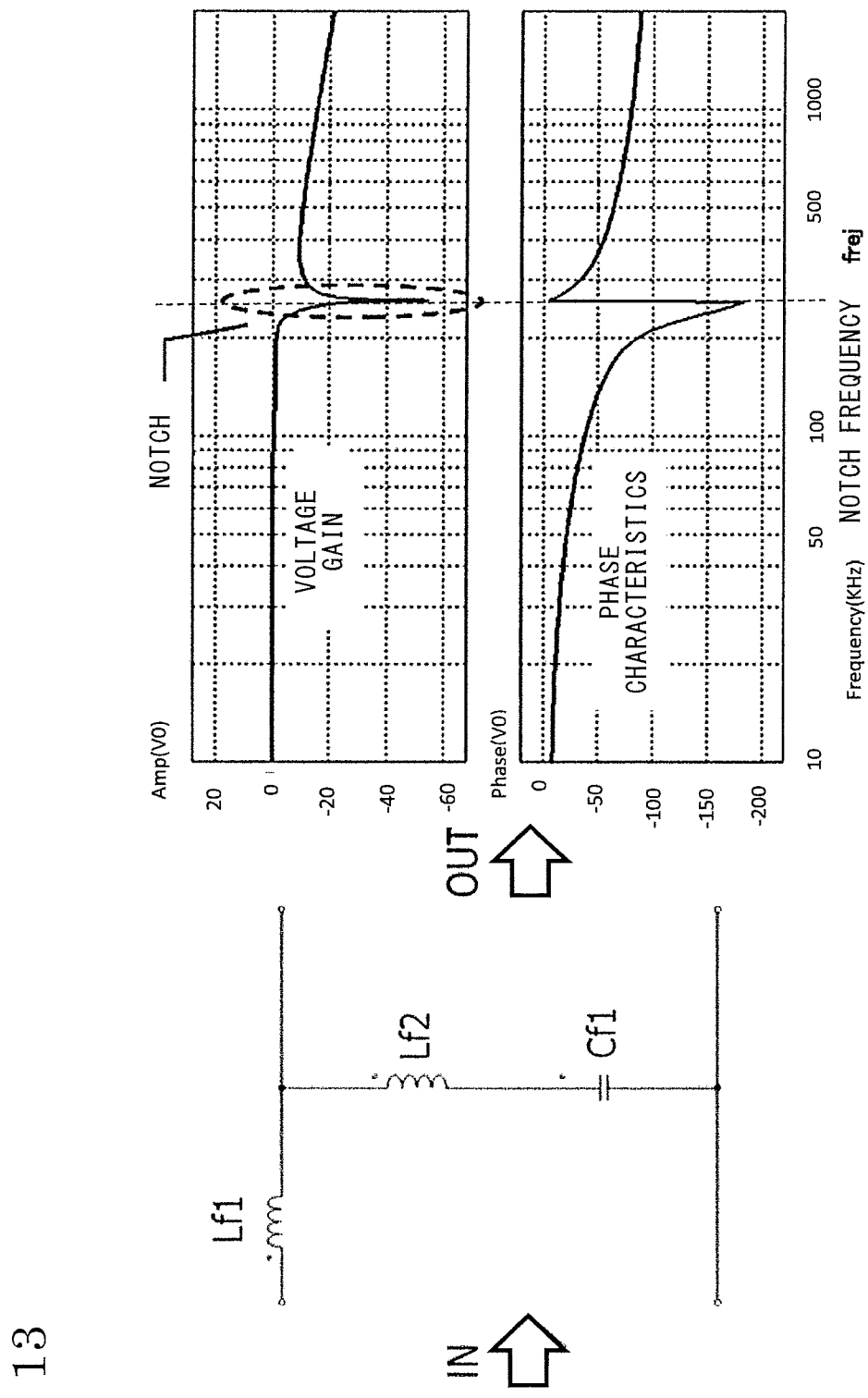
FIG. 13 is a diagram showing phase characteristics of a harmonic filter according to Embodiment 1 of the present invention.

In the present invention, the harmonic filter 04 has the structure shown in FIG. 1. The harmonic filter 04 has phase characteristics shown in FIG. 13. The harmonic filter 04 can greatly attenuate only a specific frequency component (hereinafter referred to as notch frequency), and is advantageous in terms of power loss and phase characteristics over the RC filter, the LR filter, and the LC filter. When the third-order harmonic $3f_{inv}$, of the driving frequency of the inverter 01 is made to coincide with the notch frequency $f_{rej}$ of the harmonic filter, the third-order harmonic component of the current flowing into the power transmission coil 06 can be reduced with little power loss.

Problem of Harmonic Filter

Figure 14:
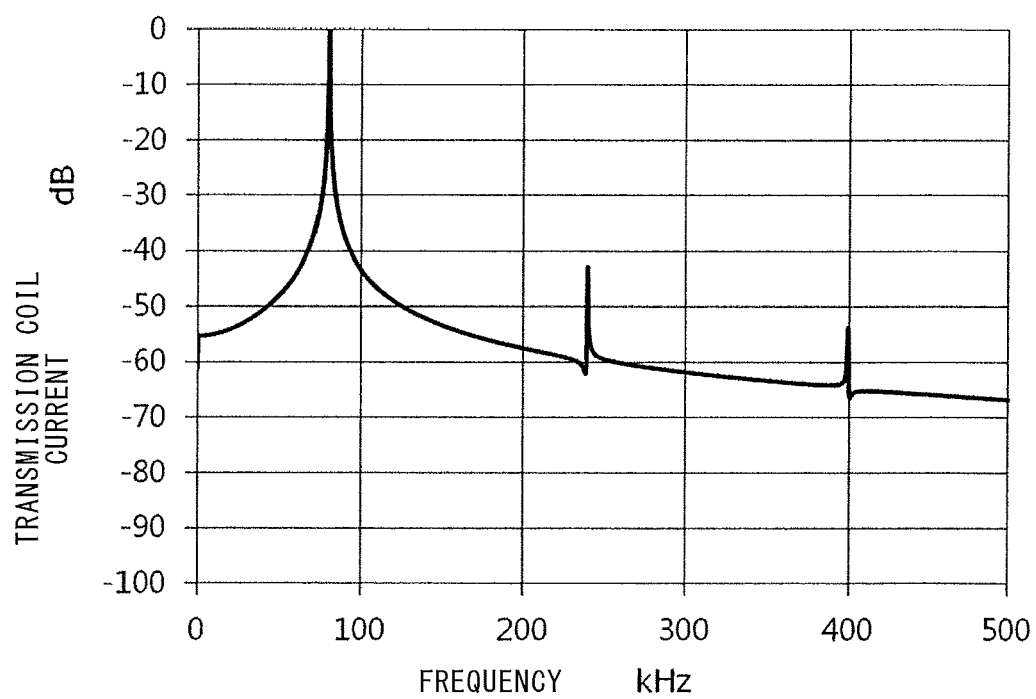
FIG. 14 is a diagram showing an analysis result of fast Fourier transform on the current flowing through the power transmission coil when the harmonic filter shown in FIG. 12 is used.

In the harmonic filter 04, however, attenuation at frequencies other than the notch frequency $f_{rej}$ is small whereas attenuation at the notch frequency $f_{rej}$ is great. Since the harmonic filter 04 is composed of the reactors (Lf1, Lf2) and the capacitor (Cf1), the value of the notch frequency $f_{rej}$ slightly varies among individual filters due to manufacturing errors of the reactors and the capacitor. For example, in a power conversion device having a harmonic filter of which notch frequency $f_{rej}$ is 246 kHz, when the inverter 01 is operated at driving frequency of 80 kHz, the third-order harmonic is 240 kHz, and a difference of 6 kHz is generated between the notch frequency $f_{rej}$ and the third-order harmonic. An FFT analysis result of the current flowing through the power transmission coil 06 in this case is shown in FIG. 14. The third-order harmonic component is −43 dB, and the effect of harmonic reduction is only 3 dB as compared with the result shown in FIG. 12. Accordingly, it is desirable to control the inverter driving frequency such that the notch frequency $f_{rej}$ coincides with the third-order harmonic $3f_{inv}$ of the inverter 01.

As a method for this control, it is conceivable that the driving frequency of the inverter 01 is varied, the current flowing through the power transmission coil 06 is subjected to FFT analysis for each frequency, and the driving frequency is controlled to a frequency at which the third-order harmonic is minimized. However, FFT analysis performed individually on the current flowing through the power transmission coil 06 is not practical in terms of cost. Accordingly, control other than the aforementioned FFT analysis is required.

Solution to Problem of Harmonic Filter

Hereinafter, an inverter driving frequency control by a method other than the FFT analysis will be described.

Figure 15:
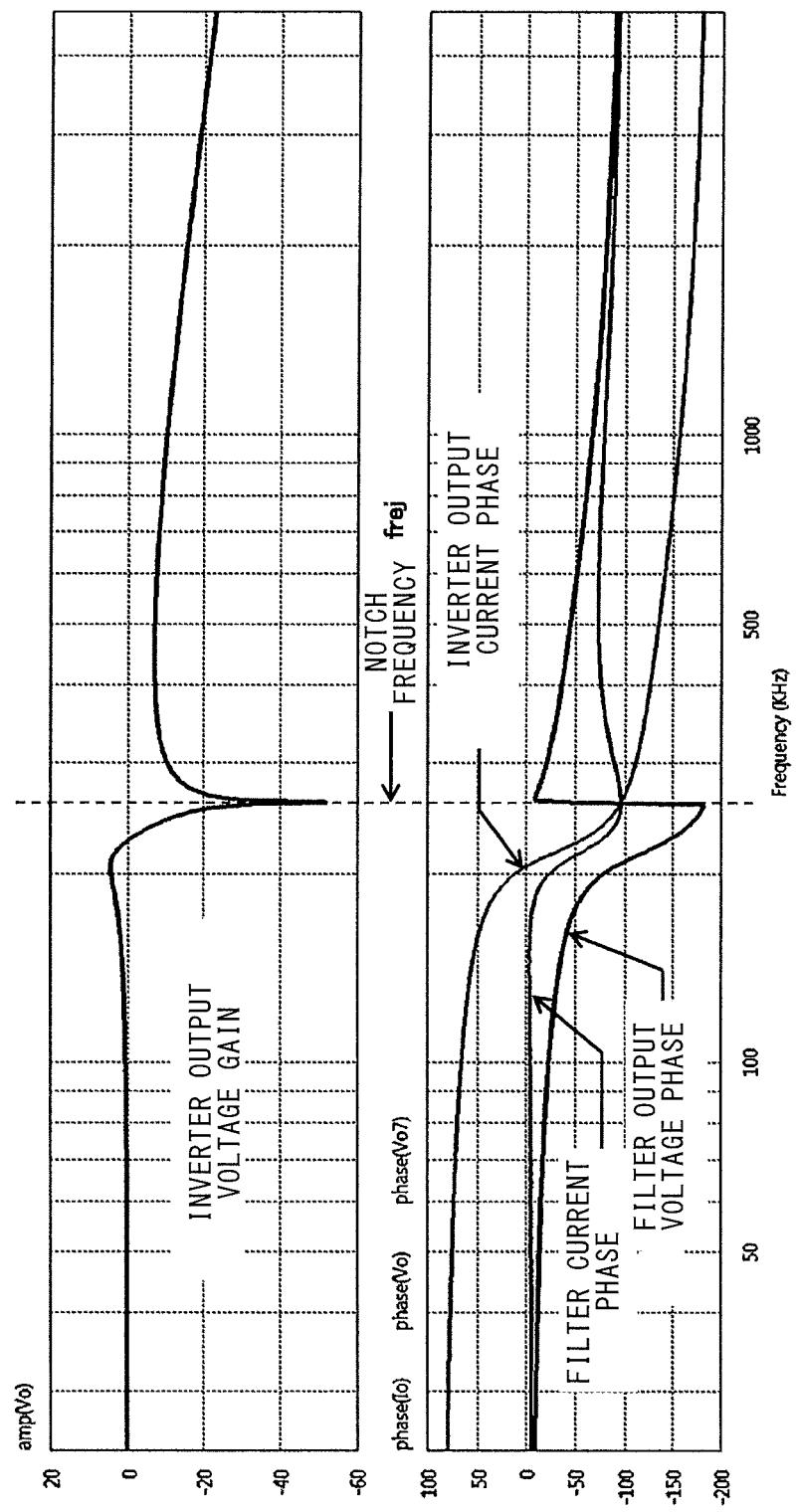
FIG. 15 is a diagram showing a result of simulation analysis performed for phase characteristics of an output current from an inverter and a filter current in the contactless power supply system shown in FIG. 5.
Figure 16:
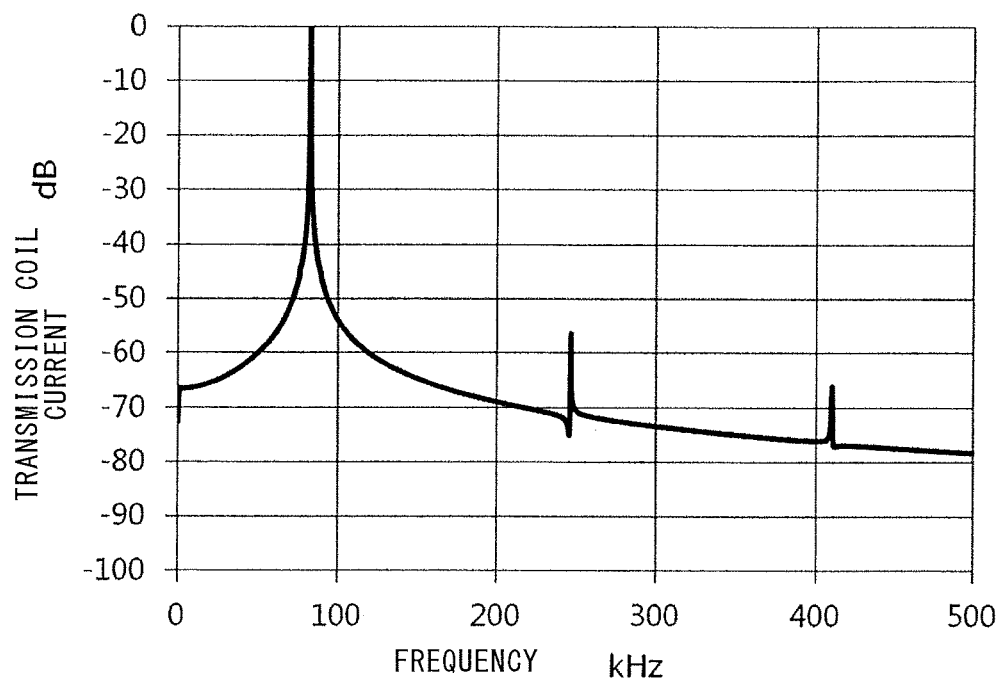
FIG. 16 is a diagram showing an analysis result of fast Fourier transform on the current flowing through the power transmission coil when the inverter driving frequency control according to Embodiment 1 of the present invention is performed.

FIG. 15 shows a result of simulation analysis performed on phase characteristics of an output current from the inverter 01 and a filter current in the circuit shown in FIG. 5. This analysis is performed using a filter input voltage as a reference. At the notch frequency $f_{rej}$, the phase of the filter current and the phase of the inverter output current coincide with each other. When the driving frequency is lower than the notch frequency $f_{rej}$, the phase of the inverter output current advances with respect to the phase of the filter current. On the other hand, when the driving frequency is higher than the notch frequency $f_{rej}$, the phase of the inverter output current lags behind the phase of the filter current. That is, at the notch frequency $f_{rej}$, the phase relationship between the inverter output current and the filter current is inverted. By utilizing this result, the inverter driving frequency can be controlled, without performing FFT analysis, so as to maximize the harmonic attenuation in the harmonic filter. Specifically, as described in the section [Basic operation], when the zero-cross point $Z_{inv}$ of the inverter output current lags behind the zero-cross point $Zf_{fil}$ of the filter current, the inverter driving frequency $f_{inv}$, is lowered; whereas, when the zero-cross point $Z_{inv}$ of the inverter output current advances with respect to the zero-cross point $Z_{fil}$ of the filter current, the inverter driving frequency $f_{inv}$, is increased. Thus, the inverter driving frequency controlled so as to make the zero-cross point $Z_{inv}$, of the inverter output current and the zero-cross point $Z_{fil}$ of the filter current coincide with each other. FIG. 16 shows a result of FFT analysis performed on the current flowing through the power transmission coil in the case where the driving frequency of the inverter 01 is controlled. In FIG. 16, the third-order harmonic component is −57 dB, which indicates that the harmonic reduction effect of 17 dB is achieved as compared with the result shown in FIG. 12.

Effects

According to the aforementioned configuration and control method, the notch frequency of the harmonic filter can be made to coincide with the third-order harmonic component of the inverter driving frequency, whereby the harmonic reduction effect by the harmonic filter can be maximally exerted.

Embodiment 2

Configuration

In Embodiment 1 described above, the inverter output voltage detector 02 is used as means for detecting rising of the inverter output voltage. In another method, the frequency control described in Embodiment 1 may be performed with falling of a gate signal that controls the operation of the inverter 01 being regarded as rising of the inverter output voltage.

Operation

Figure 17:
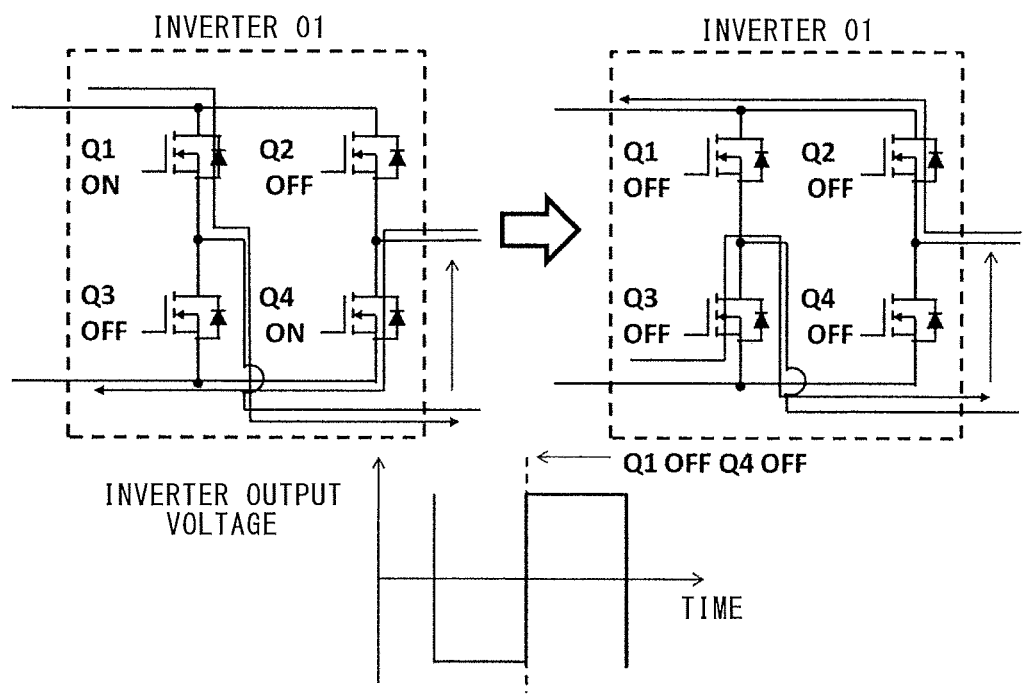
FIG. 17 is a diagram showing the relationship between ON/OFF of an inverter and rising of an output voltage from the inverter, according to Embodiment 2 of the present invention.

A specific example of this application will be described. A full-bridge inverter is used as the inverter 01. FIG. 17 shows the relationship between ON/OFF of the inverter 01 and rising of the inverter output voltage. Each of the switches in the inverter 01 consists of a transistor such as a MOSFET. A moment at which a switch Q1 and a switch Q4 change from the ON states to the OFF states is considered. At this moment, the output voltage of the inverter 01 rises. Regarding the change from ON to OFF of the switch Q1 and the switch Q4, falling of the gate signal inputted to the switch Q1 and the switch Q4 is regarded as rising of the inverter output voltage, whereby the inverter driving frequency control described in Embodiment 1 can be performed. This is an example of means of using falling of the gate signal inputted to the switch in the inverter 01 as an alternative for rising of the inverter output voltage. Although the full-bridge inverter is described as an example of the inverter 01 of the present embodiment, a control method using a half-bridge inverter or other inverters is also within the scope of the present embodiment. Further, when detection of the falling of the gate signal is used as an alternative for detection of the rising of the inverter output voltage, delay from the falling of the gate signal to the rising of the inverter output voltage may be included.

Effects

The configuration of Embodiment 2 can be used as an alternative for the inverter output voltage detector 02, thereby realizing downsizing, and reduction in the number of components.

Embodiment 3

Configuration

Figure 18:
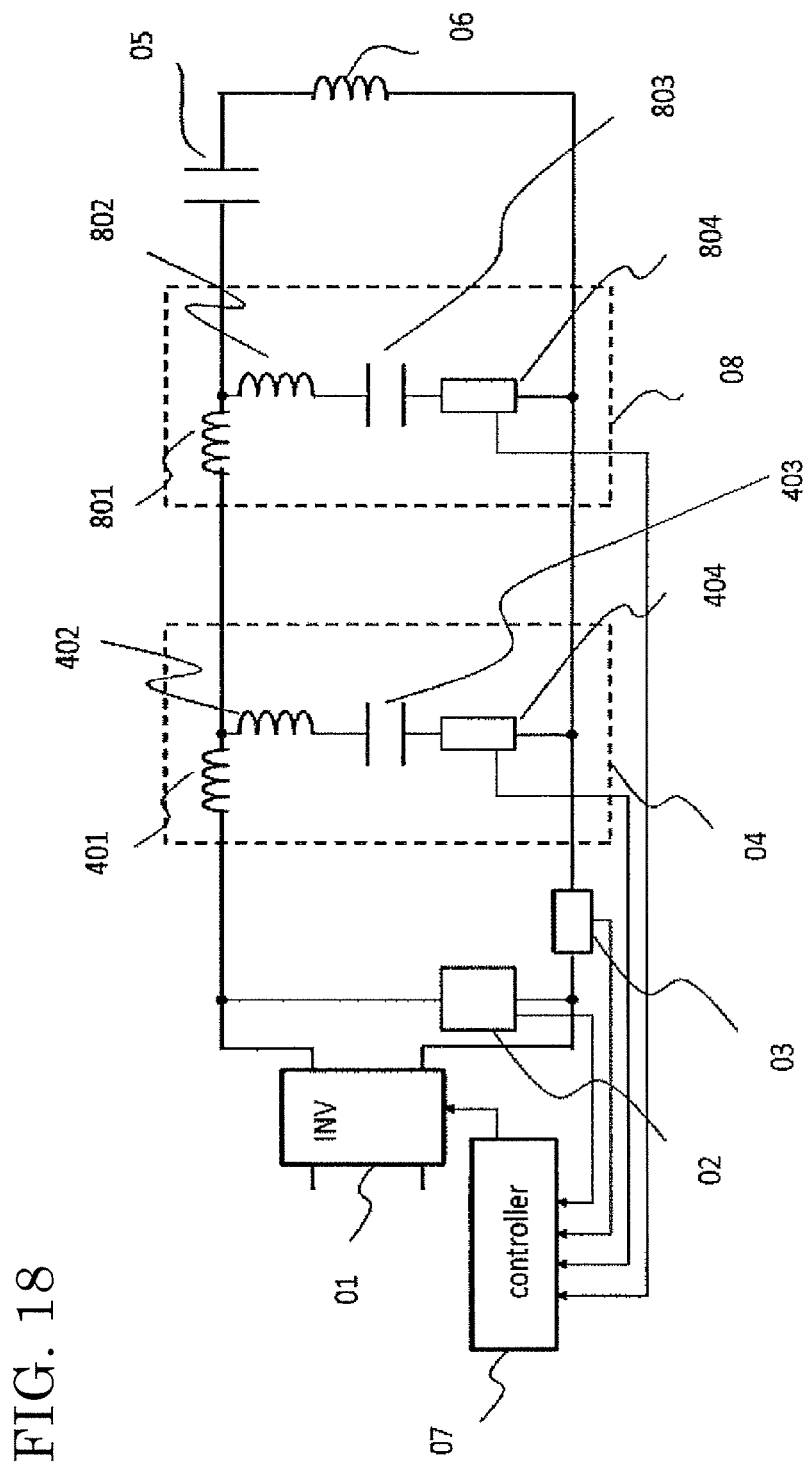
FIG. 18 is a diagram showing the entire configuration of a power conversion device according to Embodiment 3 of the present invention.

FIG. 18 shows the entire configuration of a power conversion device according to Embodiment 3 of the present invention. The inverter output voltage detector 02 and the inverter output current detector 03 are connected to the output side of the inverter 01 that supplies high-frequency power. The harmonic filter 04 is connected at a stage subsequent to the inverter output voltage detector 02 and the inverter output current detector 03, and a harmonic filter 08 is connected at a stage subsequent to the harmonic filter 04. The power transmission capacitor 05 and the power transmission coil 06 are connected at a stage subsequent to the harmonic filter 08.

The harmonic filter 04 is composed of the first filter reactor 401, the second filter reactor 402, the filter capacitor 403, and the filter current detector 404. The harmonic filter 08 is composed of a third filter reactor 801, a fifth filter reactor 802, a filter capacitor 803, and a filter current detector 804.

In this configuration, for example, the harmonic filter 04 is set for reducing the third-order harmonic, and the harmonic filter 08 is set for reducing the fifth-order harmonic, whereby two harmonic components, i.e., the third-order harmonic and the fifth-order harmonic, can be reduced.

Operation

When the harmonic filter 04 is set for reducing the third-order harmonic and the harmonic filter 08 is set for reducing the fifth-order harmonic, the frequency control described in Embodiment 1 is performed in accordance with one of the harmonic components. Although the configuration in which two harmonic filters are connected is described in Embodiment 3, three or more harmonic filters may be connected.

Effects

Using the configuration of Embodiment 3, the effect of reducing a plurality of harmonic components can be achieved.

Embodiment 4

Configuration

Figure 19:
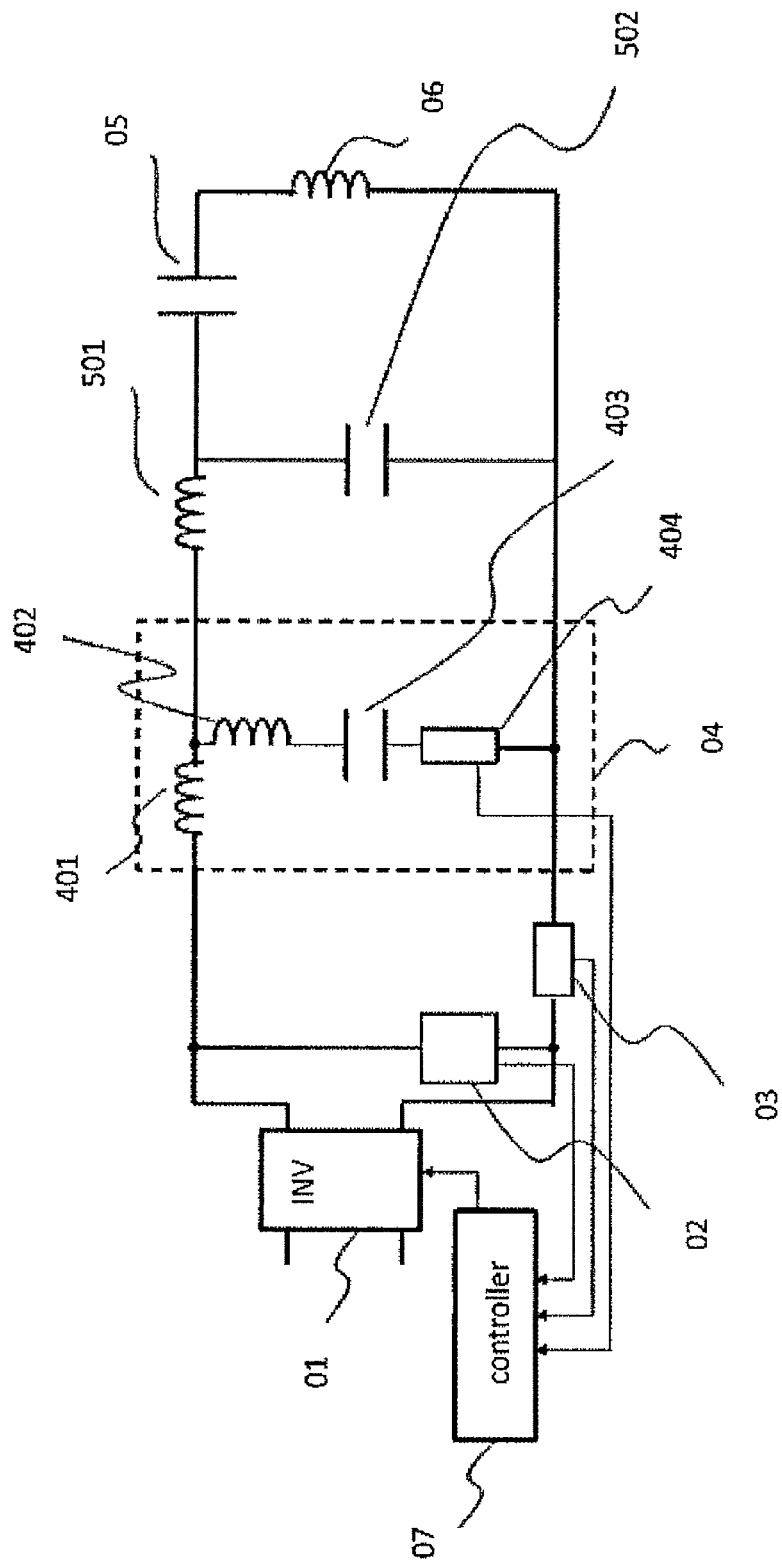
FIG. 19 is a diagram showing the entire configuration of a power conversion device according to Embodiment 4 of the present invention.

FIG. 19 shows the configuration of a power conversion device according to Embodiment 4. The inverter output voltage detector 02 and the inverter output current detector 03 are connected to the output side of the inverter 01 that supplies high-frequency power. The harmonic filter 04 composed of the first filter reactor 401, the second filter reactor 402, the filter capacitor 403, and the filter current detector 404 is connected at a stage subsequent to the inverter output voltage detector 02 and the inverter output current detector 03. A higher-order harmonic filter composed of a third filter reactor 501 and a second filter capacitor 502 is connected at a stage subsequent to the harmonic filter 04, and the power transmission capacitor 05 and the first power transmission coil 06 are connected at a stage subsequent to the higher-order harmonic filter.

Figure 20:
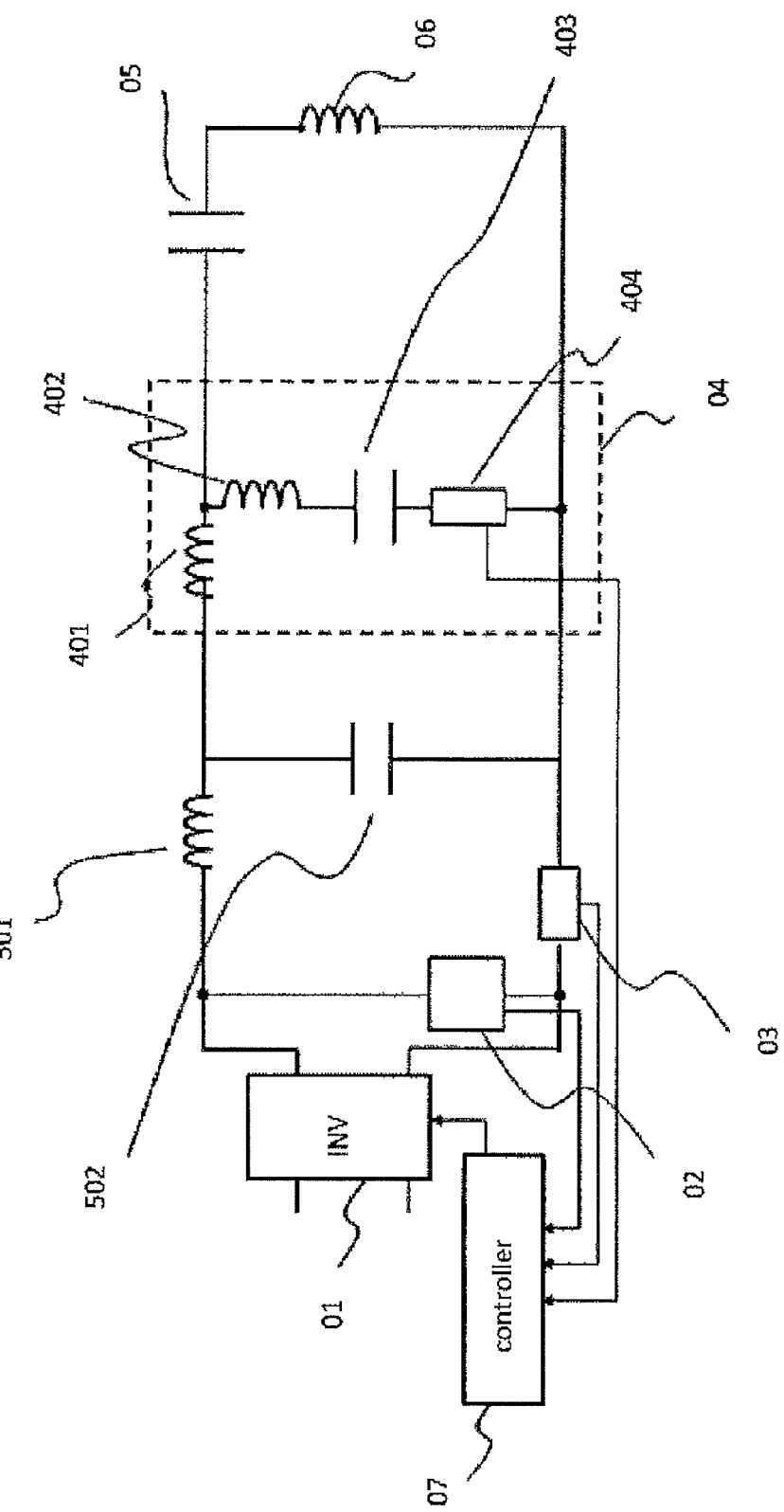
FIG. 20 is a diagram showing the entire configuration of another power conversion device according to Embodiment 4 of the present invention.

As shown in FIG. 20, the higher-order harmonic filter composed of the third filter reactor 501 and the second filter capacitor 502 may be connected at a stage preceding to the harmonic filter 04. The controller 07 is composed of the microcomputer 071 and the like. The controller 07 receives signals from the inverter output voltage detector 02, the inverter output current detector 03, and the filter current detector 404 at zero-cross timings of the signals in the respective detectors, and controls the driving frequency of the inverter in accordance with the signals.

Effects

Since the third filter reactor 501 and the second filter capacitor 502 are added, a higher-order harmonic component having a frequency higher than the notch frequency $f_{rej}$ can also be reduced.

Embodiment 5

Configuration

Figure 21:
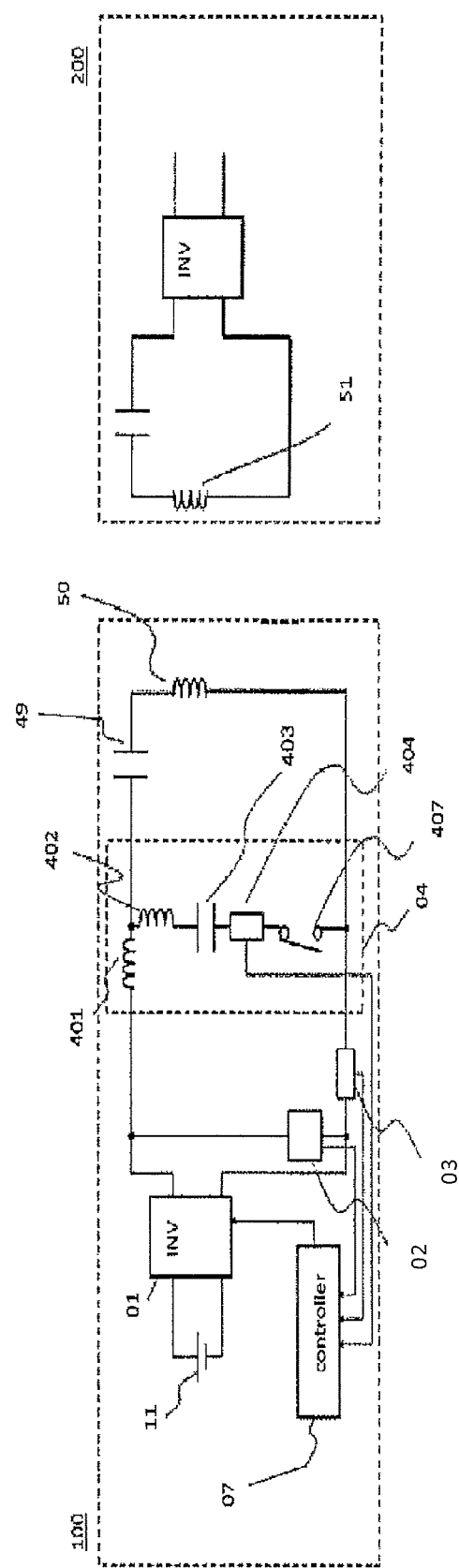
FIG. 21 is a diagram showing the entire configuration of a contactless power supply system according to Embodiment 5 of the present invention.

FIG. 21 shows the configuration of a contactless power supply system according to Embodiment 5 of the present invention.

A first power conversion device 100 includes: the inverter 01 that supplies high-frequency power; and the inverter output voltage detector 02 and the inverter output current detector 03 connected to the output side of the inverter 01. The harmonic filter 04 composed of the first filter reactor 401, the second filter reactor 402, the filter capacitor 403, the filter current detector 404, and a filter selection switch 407 is connected at a stage subsequent to the inverter output voltage detector 02 and the inverter output current detector 03. A capacitor 49 and a first contactless power supply coil 50 are connected at a stage subsequent to the harmonic filter 04. The controller 07 is composed of the microcomputer 071 and the like. The controller 07 receives signals from the inverter output voltage detector 02, the inverter output current detector 03, and the filter current detector 404 at zero-cross timings of the signals in the respective detectors, and controls the driving frequency of the inverter in accordance with the signals. The filter selection switch 407 may be either a mechanical switch or a semiconductor switch.

Further, a second power conversion device 200 including a second contactless power supply coil 51 is provided. The first contactless power supply coil 50 and the second contactless power supply coil 51 are joined to each other via a magnetic field, and are able to transmit/receive power to/from each other.

Operation

When power is transmitted from the first power conversion device 100 to the second power conversion device 200, the filter selection switch 407 is turned ON, followed by the same operation as described in Embodiment 1, thereby reducing the harmonic component of the current in the first contactless power supply coil 50.

On the other hand, when the first power conversion device 100 receives power from the second power conversion device 200, the filter selection switch 407 is turned OFF to prevent a current from flowing into the path of the filter capacitor 403 in the harmonic filter 04.

Effects

Since the filter selection switch 407 is provided, the current in the path of the filter capacitor 403 can be interrupted during power reception, thereby reducing loss due to the harmonic filter 04, and preventing reduction in efficiency due to variation of resonance conditions.

Embodiment 6

Configuration

Figure 22:
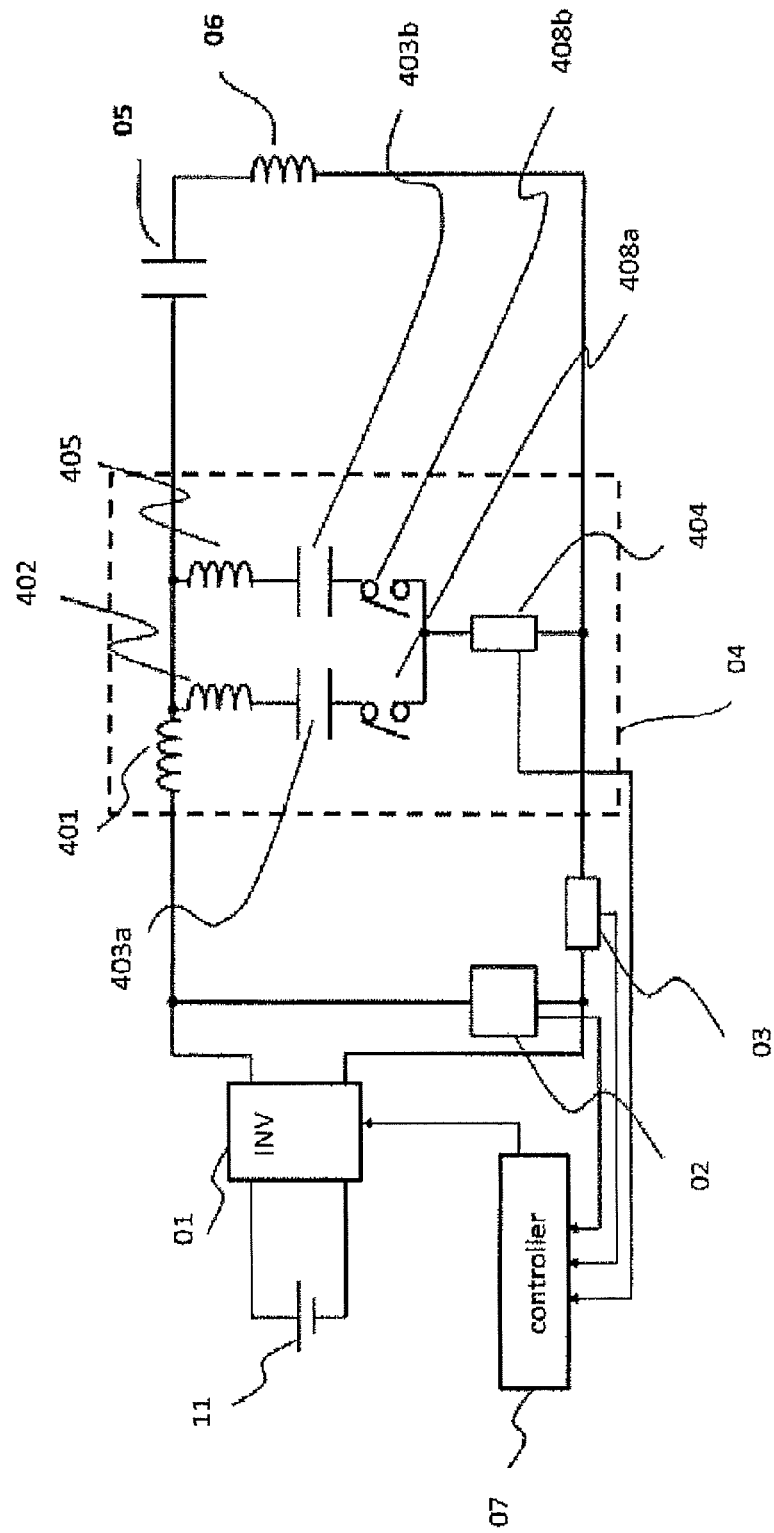
FIG. 22 is a diagram showing the entire configuration of a power conversion device according to Embodiment 6 of the present invention.

FIG. 22 shows the configuration of a power conversion device according to Embodiment 6. The power conversion device includes: the inverter 01 that supplies high-frequency power; and the inverter output voltage detector 02 and the inverter output current detector 03 connected to the output side of the inverter 01. The harmonic filter 04 composed of the first filter reactor 401, the second filter reactor 402, a fourth filter reactor 405, a first filter capacitor 403$a$, a third filter capacitor 403$b$, a filter selection switch 408$a$, a filter selection switch 408$b$, and a filter current detector 404 is connected at a stage subsequent to the inverter output voltage detector 02 and the inverter output current detector 03. The power transmission capacitor 05 and the power transmission coil 06 are connected at a stage subsequent to the harmonic filter 04.

The controller 07 is composed of the microcomputer 071 and the like. The controller 07 is able to receive signals from the inverter output voltage detector 02, the inverter output current detector 03, and the filter current detector 404 at zero-cross timings of the signals in the respective detectors, and control the driving frequency of the inverter in accordance with the signals.

As one example, setting of the harmonic filter 04 will be described. The value of the filter is set such that the n-th order harmonic at driving frequency fa of the inverter can be reduced by the first filter reactor 401, the second filter reactor 402, and the first filter capacitor 403$a$. Further, the value of the filter is set such that the n-th order harmonic at driving frequency fb of the inverter can be reduced by the first filter reactor 401, the fourth filter reactor 405, and the third filter capacitor 403$b$.

Operation

The harmonic filter 04 is operated in the vicinity of the inverter driving frequency fa, with the filter selection switch 408$a$ being ON, and the filter selection switch 408$b$ being OFF. The basic operation is the same as that described in Embodiment 1. During the operation, there is no problem if predetermined power is outputted. However, depending on the condition, there are cases where the predetermined power is not outputted. For example, if coupling coefficient greatly changes due to displacement between the coils, load impedance viewed from the inverter also greatly changes. In this case, the predetermined power cannot be outputted unless the inverter driving frequency is changed. Under such conditions, when the operation frequency of the inverter is to be changed, the filter selection switch 408$a$ is turned OFF and the filter selection switch 408$b$ is turned ON. Thus, even when the inverter driving frequency is changed from fa to fb, the n-th order harmonic thereof can be reduced.

When the power conversion device receives power, the current flowing through the harmonic filter 04 can be interrupted, with both the filter selection switch 408$a$ and the filter selection switch 408$b$ being turned OFF.

Effects

Even when the operation condition greatly varies due to, for example, displacement between the coils, it is possible to deal with change in the driving frequency of the inverter, thereby enabling output of the predetermined power.

Further, since the harmonic filter is operated during power transmission and is not operated during power reception, reduction in efficiency at the harmonic filter during power reception can be avoided.

It is noted that, within the scope of the present invention, the above embodiments may be freely combined with each other, or each of the above embodiments may be modified or simplified as appropriate.

In the drawings, the same reference characters denote the same or corresponding portions.

DESCRIPTION OF THE REFERENCE CHARACTERS

01 inverter
02 inverter output voltage detector
03 inverter output current detector
04, 08 harmonic filter
05 power transmission capacitor
06 power transmission coil
07 controller
12 power-receiving coil
13 power-receiving capacitor
14 rectifier diode
15 load
49 capacitor
50 first contactless power supply coil
51 second contactless power supply coil
071 microcomputer
072 memory
100 first power conversion device
200 second power conversion device
301, 411 current measurement element
303, 413 comparator
304, 414 operational amplifier
401 first filter reactor
402 second filter reactor
403, 803 filter capacitor
403$a$ first filter capacitor
403$b$ third filter capacitor
502 second filter capacitor
405 fourth filter reactor
404, 804 filter current detector
501, 801 third filter reactor
407, 408$a$, 408$b$ filter selection switch

The invention claimed is:

1. A power conversion device comprising:
an inverter for supplying high-frequency power to a coil;
a harmonic filter including a first filter reactor connected to an output end of the inverter, a second filter reactor connected in series to the first filter reactor, a first filter capacitor connected in series to the second filter reactor, and a filter current detector for detecting a zero-cross point of a filter current that flows through the second filter reactor; and a controller for controlling the inverter, wherein the controller performs control so as to make a zero-cross point of an output current from the inverter coincide with the zero-cross point of the filter current that flows through the second filter reactor.

2. The power conversion device according to claim 1, further comprising:

an inverter output voltage detector for detecting rising of an output voltage from the inverter; and an inverter output current detector for detecting the zero-cross point of the output current from the inverter, wherein after the rising of the output voltage from the inverter has been detected, if the zero-cross point of the inverter output current is detected earlier than the zero-cross point of the filter current, the controller performs control to increase inverter driving frequency, and if the zero-cross point of the filter current is detected earlier than the zero-cross point of the inverter output current, the controller performs control to reduce the inverter driving frequency.

3. The power conversion device according to claim 1, wherein after falling of a gate signal inputted from the controller to the inverter has been detected, if the zero-cross point of the output current is detected earlier than the zero-cross point of the filter current, control is performed so as to increase the inverter driving frequency, and if the zero-cross point of the filter current is detected earlier than the zero-cross point of the output current of the inverter, control is performed so as to reduce the inverter driving frequency.

4. The power conversion device according to claim 1, wherein a higher-order harmonic filter circuit composed of a third filter reactor and a second filter capacitor is connected at a connection point between the first filter reactor and the second filter reactor of the harmonic filter.

5. The power conversion device according to claim 1, wherein a higher-order harmonic filter circuit composed of a third filter reactor and a second filter capacitor is connected between the inverter and the harmonic filter.

6. The power conversion device according to claim 1, wherein a filter selection switch is connected in series to the first filter capacitor of the harmonic filter, and the filter selection switch is turned ON when power is transmitted, and is turned OFF when power is received.

7. A power conversion device according to claim 1, further comprising:

a first filter selection switch connected in series to the first filter capacitor of the harmonic filter;

a fourth filter reactor connected in parallel to the second filter reactor;

a third filter capacitor connected in series to the fourth filter reactor; and a second filter selection switch connected in series to the third filter capacitor, wherein the first filter selection switch and the second filter selection switch are connected to the filter current detector, when power is transmitted, control is performed such that either of the first filter selection switch or the second filter selection switch is turned ON while the other is turned OFF, and when power is received, control is performed such that both the first filter selection switch and the second filter selection switch are turned OFF.

8. The power conversion device according to claim 2, wherein the filter current detector is composed of a first current measurement element, and a first comparator for comparing an inter-terminal voltage of the first current measurement element with a first reference voltage, and outputs, to the controller, rising of an output from the first comparator, as a zero-cross point of the filter current, and the inverter output current detector is composed of a second current measurement element, and a second comparator for comparing an inter-terminal voltage of the second current measurement element with a second reference voltage, and outputs, to the controller, rising of the output from the second comparator, as a zero-cross point of the inverter output current.

9. The power conversion device according to claim 2, wherein the filter current detector is composed of a first current measurement element and a first operational amplifier, an output from the first operational amplifier is converted from analog to digital by the controller to measure the filter current, and the zero-cross point of the filter current is detected based on inversion of a sign of the measured current value, and the inverter output current detector is composed of a second current measurement element and a second operational amplifier, an output from the second operational amplifier is converted from analog to digital by the controller to measure the output from the inverter, and the zero-cross point of the inverter output current is detected based on inversion of a sign of the measured current value.

10. The power conversion device according to claim 8, wherein the first current measurement element and the second current measurement element are current detection resistors or current transformers.

11. The power conversion device according to claim 1, wherein a plurality of stages of the harmonic filters are provided, and the controller performs control such that a zero-cross point of a filter current of any one of the harmonic filters is made to coincide with the zero-cross point of the output current from the inverter.

12. A contactless power supply system comprising:

the power conversion device according to claim 1;

a power-receiving coil being magnetically coupled with the coil supplied with the high-frequency power, and being supplied with power in a contactless manner by the coil; and a rectifier for rectifying an output from the power-receiving coil, and supplying power to a load.

13. The power conversion device according to claim 9, wherein the first current measurement element and the second current measurement element are current detection resistors or current transformers.

* * * * *